United States Patent [19]

Veendrick et al.

[11] Patent Number: 5,264,738
[45] Date of Patent: Nov. 23, 1993

[54] FLIP-FLOP CIRCUIT HAVING TRANSFER GATE DELAY

[75] Inventors: Hendrikus J. M. Veendrick; Andreas A. J. M. Van Den Elshout; Cornelis M. Huizer, all of Eindhoven, Netherlands

[73] Assignee: U.S. Philips Corp., New York, N.Y.

[21] Appl. No.: 891,314

[22] Filed: May 29, 1992

[30] Foreign Application Priority Data

May 31, 1991 [EP] European Pat. Off. ........ 91201316.6

[51] Int. Cl.⁵ ................... H03K 5/13; H03K 19/096; H03K 3/26
[52] U.S. Cl. .................... 307/272.2; 307/481; 307/279; 307/594; 307/269
[58] Field of Search ................. 307/480–481, 307/279, 272.2, 594, 269

[56] References Cited

U.S. PATENT DOCUMENTS

| 4,473,760 | 9/1984 | Ambrosius, III et al. | 307/481 |
| 4,663,546 | 5/1987 | Eitrheim et al. | 307/481 |
| 4,929,850 | 5/1990 | Breuninger | 307/480 |
| 5,029,279 | 7/1991 | Sasaki et al. | 307/480 |
| 5,107,137 | 4/1992 | Kinugasa et al. | 307/481 |
| 5,132,577 | 7/1992 | Ward | 307/272.2 |

Primary Examiner—Margaret R. Wambach
Attorney, Agent, or Firm—Steven R. Biren

[57] ABSTRACT

The transfer gate between the master section and the slave section in a flip-flop circuit includes a circuit for reducing the sensitivity to slow clock edges and clock skew. This is accomplished by prolonging the transfer time for data from the master to the salve section of the flip-flop circuit.

4 Claims, 1 Drawing Sheet

FLIP-FLOP CIRCUIT HAVING TRANSFER GATE DELAY

BACKGROUND OF THE INVENTION

The invention relates to an electronic flip-flop circuit, having a data input, a data output, and a clock signal input, and comprising a first transfer gate for transferring, under the control of the clock signal, data from the data input to an input of a first storage element, and a second transfer gate for transferring, under the control of the clock signal, data from an output of the first storage element to an input of a second storage element, an output of which constitutes the data output, the transfer gates being directly driven by the same clock signal.

The invention also relates to an integrated circuit comprising such an electronic tip-flop circuit.

An electronic flip-flop circuit of this kind is known from U.S. Pat. No. 4,390,987. The prior-art circuit described therein with reference to FIG. 1 comprises a first transfer gate in the form of a pMOS transistor 22 and a second transfer gate in the form of an nMOS transistor 34, both transistors being driven by a clock signal 46. When the flip-flop circuit is very fast in relation to the edges of the clock signal, a transparent state will arise halfway along an edge of the clock signal: the data on the data input of the flip-flop circuit is transferred directly to the data output. This implies an incorrect logic state in the circuit including the flip-flop circuit. So-called "clock skew" can also give rise to an incorrect logic state. This is because when two series-connected flip-flop circuits are driven by two clock signals via different clock paths, it may occur that a clock pulse of the clock signal of the second flip-flop arrives slightly later than a corresponding clock pulse of the clock signal of the first flip-flop. The first flip-flop then assumes a next logic state while the second flip-flop has not yet fully assumed the current logic state. Thus, the second flip-flop prematurely assumes the next logic state. Furthermore, the known flip-flop circuit has the significant drawback that the pMOS transistor 22 has a high threshold voltage loss.

SUMMARY OF THE INVENTION

It is inter alia an object of the invention to provide an improved electronic flip-flop circuit which is less sensitive to slow clock edges and clock skew.

To achieve this, an electronic flip-flop circuit in accordance with the invention is characterized in that the second transfer gate comprises means for prolonging the transfer time for data from the first to the second storage element. This prevents the occurrence of a transparent state in the flip-flop circuit in the event of comparatively slow clock edges. It is thus precluded that the data is applied immediately from the data input to the data output of the flip-flop circuit. Moreover, the described clock skew problems are thus avoided.

An embodiment of an electronic flip-flop circuit in accordance with the invention is characterized in that said means comprise a pMOS transistor and an nMOS transistor whose gates are connected to the output of the first storage element and whose drains are connected to the input of the second storage element, the source of the pMOS transistor being connected to the drain of a further pMOS transistor whose source is connected to a supply voltage and whose gate is connected to the clock signal, the source of the nMOS transistor being connected to the drain and the gate of a further nMOS transistor whose source is connected to the clock signal. This implementation requires little chip surface area and has been found to be very effective. Moreover, this embodiment offers the advantage that hardly any threshold voltage loss occurs across the second transfer gate, said loss also being acceptably small across the first transfer gate (the nMOS transistor 4).

A further embodiment of an electronic flip-flop circuit in accordance with the invention is characterize in that an additional inverting element is connected to the output of the second storage element. As a result, the data output of the flip-flop circuit supplies a non-inverted signal. The inverter also serves as a buffer.

A further embodiment of an electronic flip-flop circuit in accordance with the invention is characterized in that an additional inverting element is connected to the clock signal input. Overburdening of the clock signal when use is made of a large number of flip-flop circuits with the same clock signal is thus prevented.

BRIEF DESCRIPTION OF THE DRAWING

The invention will be described in detail hereinafter with reference to the following Figures wherein.

DESCRIPTION OF THE PREFERRED EMBODIMENTS

Figure 1:
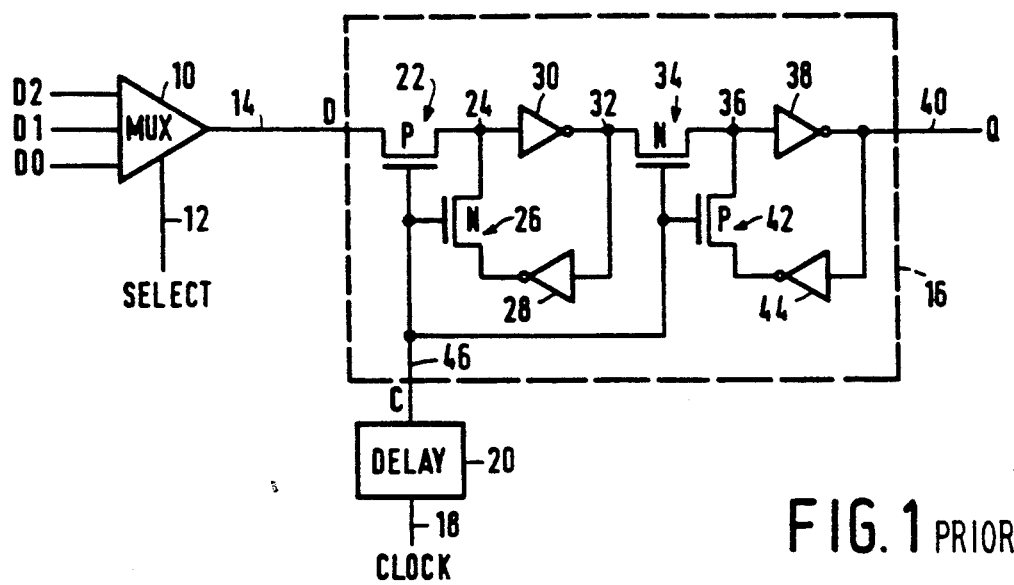
FIG. 1 shows a known electronic flip-flop circuit.

FIG. 1 shows an electronic flip-flop circuit which is known from U.S. Pat. No. 4,390,987. The inverting elements 30 and 28 constitute a first storage element (also referred to as a master) and the inverting elements 38 and 44 constitute a second storage element (also referred to as a slave). The pMOS transistor 22 constitutes a first transfer gate and the nMOS transistor 34 constitutes a second transfer gate. The operation of such a master/slave flip-flop circuit is known to those skilled in the art. A substantial drawback of this flip-flop circuit consists in that the threshold voltage loss across the pMOS transistor 22 may amount to as much as 2.5 V when a CMOS manufacturing technique is used with an n-well (NL-term), while in the case of a CMOS manufacturing technique with a p-well such a high threshold voltage loss occurs across the nMOS &resistor 34.

For the design of contemporary VLSI circuits (Very, Large Scale Integration) and ASICs (Application Specific Integrated Circuit) use is often made of software for automatic placement and routing. This implies that signal paths (for example, clock paths) are applied across an entire IC by software. For correct operation of a circuit the clock signals used should satisfy given conditions in respect of the rising and falling edges of the clock signal and the so-called clock skew which will be described in detail hereinafter. Because many of the contemporary software programs do not adequately take into account these clock signal conditions, it is important that a circuit is not over sensitive to these phenomena.

Figure 2:
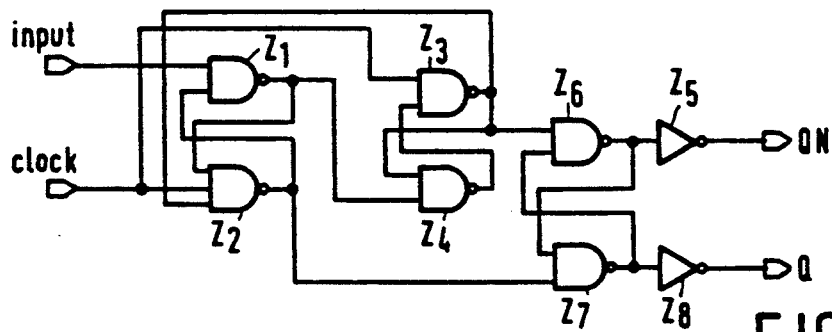
FIGS. 2 and 3 show further known electronic flip-flop circuits.
Figure 3:
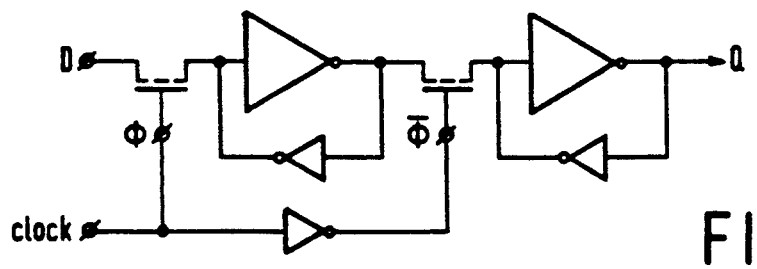

Contemporary VLSI circuits utilize flip-flop circuits which are driven by one clock signal, by two clock signals or even by four clock signals. Notably in high-density gate arrays in which little space is available for clock paths preference is given to flip-flop circuits with a single clock signal. An example of an existing D-type flip-flop circuit with one clock signal is shown in FIG. 2. This implementation consists exclusively of logic gates. It is a drawback of the flip-flop circuit shown in FIG. 2 that it occupies a comparatively large surface area: 30 transistors in the case of static CMOS implementation. A more compact D-type flip-flop circuit is shown in FIG. 3. The clock signal driving the first transfer gate is applied in inverted form to the second transfer gate. With the addition of two buffers (not shown), this flip-flop circuit consists of only 16 transistors in the case of CMOS implementation. This circuit offers the advantage over the flip-flop circuit of FIG. 1 that the two transfer gates are both nMOS transistors which have a lower threshold voltage loss than pMOS transistors when manufactured using a customary CMOS process with an n well. It is a drawback of this flip-flop circuit, however, that the inverted clock signal reaches its transfer gate with a small delay with respect to the non-inverted clock signal. As a result, the two clock signals slightly overlap so that the flip-flop circuit temporarily becomes transparent: the data at the input D is transferred directly to the output Q. Thus, an incorrect logic state occurs in the circuit which includes the flip-flop circuit. This drawback is less severe for the flip-flop circuit shown in FIG. 1, because the first transfer gate 22 and the second transfer gate 34 both receive the clock signal 46 directly. Apart from problems imposed by the high threshold voltage loss in at least one of the, transfer gates, other problems will also occur in a very fast flip-flop circuit: halfway along an edge of the clock signal a situation occurs in which both transfer gates are conductive during a brief period of time, so that the flip-flop circuit may become transparent during this brief period of time. This is because this critical time interval becomes just long enough to transfer the data from the input D to the output Q in one operation when the edges of the clock signal are not steep enough. The so-called clock skew also gives rise to problems: for example, when two flip-flop circuits are connected in series and receive their respective clock signals via different clock paths, it may occur that the clock signals reach their relevant transfer gates in mutually shifted form (this is referred to as clock skew). When a clock pulse in the second (last) flip-flop circuit reaches its transfer gate later than a corresponding clock pulse in the first flip-flop circuit, the second flip-flop circuit has not yet fully assumed the current logic state, while the first flip-flop circuit already changes over to the next logic state. As a result, the second flip-flop circuit erroneously assumes the next logic state, which again means an incorrect logic state for the circuit which includes the flip-flop circuits. The maximum permissible clock skew in the flip-flop circuits shown in the FIGS. 2 and 3 amounts to 0.4 ns and 0.3 ns, respectively. These low values cause the described problems in contemporary VLSI systems.

Figure 4:
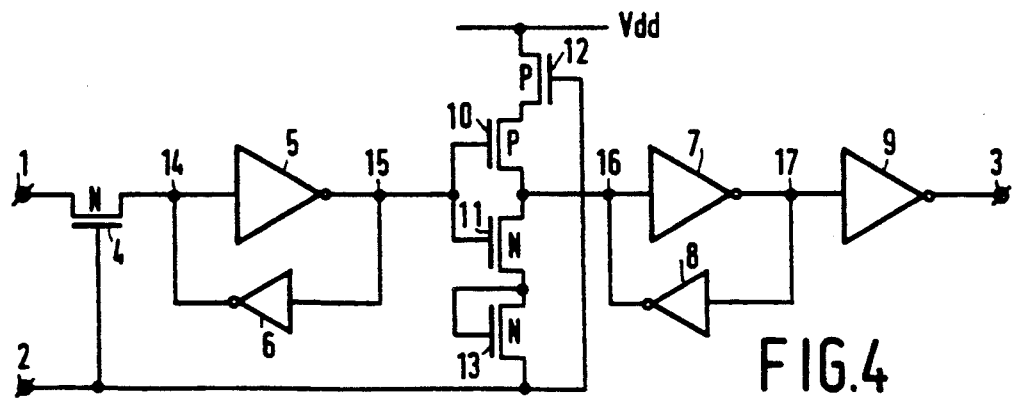
FIG. 4 shows an electronic flip-flop circuit in accordance with the invention.

FIG. 4 shows an improved flip-flop circuit in accordance with the invention. This circuit comprises a data input 1, a clock signal input 2, a data output 3, a first transfer gate which is formed by an nMOS transistor 4, a first storage element which is formed by inverting elements 5 and 6, a second storage element which is formed by inverting elements 7 and 8, possibly an additional inverting element 9 as a buffer and to ensure that the data output 3 supplies a non-inverted signal, and a second transfer gate which is formed by the pMOS transistors 10 and 12 and the nMOS transistors 11 and 13 which are connected as follows (see FIG. 4). The gates of the pMOS transistor 10 and the nMOS transistor 11 are connected to the output 15 of the first storage element and the drains are connected to the input 16 of the second storage element, the source of the pMOS transistor 10 being connected to the drain of the further pMOS transistor 12 whose source is connected to a supply voltage Vdd while its gate is connected to the clock signal, the source of the nMOS transistor 11 being connected to the drain and the gate of the further nMOS transistor 13 whose source is connected to the clock signal. The constituent transistors of the second transfer gate thus form means for prolonging the transfer time for data from the first to the second storage element. The delay thus introduced is short relative to the delay of the signal in the remainder of the flip-flop circuit, but just sufficient to achieve favorable effects on the sensitivity of the flip-flop circuit to clock skew and slow clock edges.

The operation of the flip-flop circuit is as follows. When the clock signal is high, the transistor 4 is turned on and the data at the data input 1 is taken up in the master section of the flip-flop circuit which is formed by the inverters and 6. It is to be noted that a transistor forming the inverter 5 in the first storage element, like a transistor forming the inverter 7 in the second storage element, is proportioned so as to be larger than its associated feedback inverter 6 and 8 (as shown schematically in FIG. 4 by the differently-sized inverters). The reason is that upon a transition to a new logic state, the transistors in the transfer gates must operate against the outputs of the respective feedback inverters. Therefore, these feedback inverters composed of transistors having very small aspect ratios (i.e. the ratio of the width to the length of the channel) as will be evident to those skilled in the art. Moreover, in the case of a high clock signal the transistor 12 is turned off. When the clock signal becomes low, the transistor 4 is turned off and the transistor 12 is turned on. The voltage of the source of the transistor 13 is also reduced. The transistors 10 and 11 then act as an inverting element, so that the data at the output 15 of the master section of the flip-flop circuit is transferred in inverted form to the input 16 of the slave section of the flip-flop circuit which is formed by the inverters 7 and 8. It is to be noted that this transfer is realized without incurring the large voltage loss which occurs in the flip-flop circuit shown in FIG. 1. The transistor 13 acts as a diode in order to prevent an increase of the voltage at the input 16 of the slave section in response to a positive-going edge of the clock signal. Like in the flip-flop circuit shown in FIG. 1, the clock signal simultaneously drives both transfer gates, so that the occurrence of a transparent state of the flip-flop circuit is partly counteracted. However, because no use is made of a single transistor as the second transfer gate as in the flip-flop circuit shown in FIG. 1 but instead transfer is realized via the inverting element formed by the transistors 10 and 11, some delay occurs in the transfer of the data from the master section to the slave section of the flip-flop circuit. This prevents the immediate transfer of the data at the input to the output in the event of occurrence of a brief state of the flip-flop circuit in which the transistors 4 and 12 are both turned on. Moreover, the flip-flop circuit in accordance with the invention is less sensitive to clock skew because the transfer of data from the master to the slave within the flip-flop circuit is slightly prolonged.

Upon a falling edge of the clock signal, the clock signal is also used to reduce the voltage at the input 16 of the slave section, if necessary. As a result, the clock signal is burdened to a higher degree upon a falling edge. However, this is not a problem because upon a falling edge the nMOS driver transistor of the buffer circuit of the clock signal is active, which nMOS transistor is approximately three times more of "powerful" than an equally proportioned pMOS driver transistor used for the rising edge. When a large number of flip-flop circuits in accordance with the invention are used in conjunction with a single clock signal, the clock signal can be buffered at the clock signal input in each flip-flop circuit, for example by an additional inverter.

It has been found that the described flip-flop circuit in accordance with the invention has a maximum permissible clock skew of as much as 1.1 ns and that even for clock signal edges having a duration of as much as 40 ns the flip-flop circuit does not enter a transparent state so that it still operates correctly.

Because of its reduced sensitivity to inaccurate clock signals, the flip-flop circuit in accordance with the invention is inter alia very suitable for use in integrated circuits, for example a library of standard cells for which clock paths are generated by means of software.

We claim:

1. An electronic flip-flop circuit having a data input, a data output and a clock signal input, and comprising a first transfer gate for transferring, under the control of the clock signal, data from he data input to an input of a first storage element, and a second transfer gate for transferring, under the control of the clock signal, data from an output of the first storage element to an input of a second storage element, an output of which constitutes the data output, the transfer gates being directly driven by the same clock signal, characterized in that the second transfer gate comprises means for prolonging the transfer time for data from the first to the second storage element, said means comprising a pMOS transistor and an nMOS transistor whose gates are connected to the output of the first storage element and whose drains are connected to the input of the second storage element, the source of the pMOS transistor being connected to the drain of a further pMOS transistor whose source is connected to a supply voltage and whose gate is connected to the clock signal, the source of the nMOS transistor being connected to the drain and the gate of a further nMOS transistor whose source is connected to the clock signal.

2. An electronic flip-flop circuit as claimed in claim 1, characterized in that an additional inverting element is connected to the output of the second storage element.

3. An electronic flip-flop circuit as claimed in claim 1, characterized in that an additional inverting element is connected to the clock signal input.

4. An integrated circuit comprising an electronic flip-flop circuit as claimed in claim 1.

* * * * *